(12) United States Patent
Huang et al.

(10) Patent No.: US 7,741,709 B2
(45) Date of Patent: Jun. 22, 2010

(54) EMBEDDED TYPE MULTIFUNCTIONAL INTEGRATED STRUCTURE FOR INTEGRATING PROTECTION COMPONENTS AND METHOD FOR MANUFACTURING THE SAME

(75) Inventors: Chien-Hao Huang, Taipei (TW); Wen-Chih Li, Shueishang Township, Chiayi County (TW)

(73) Assignee: Inpaq Technology Co., Ltd., Hsinchu (TW)

(*) Notice: Subject to any disclaimer, the term of this patent is extended or adjusted under 35 U.S.C. 154(b) by 201 days.

(21) Appl. No.: 12/007,284

(22) Filed: Jan. 9, 2008

(65) Prior Publication Data

US 2009/0174974 A1    Jul. 9, 2009

(51) Int. Cl.
  *H01L 23/552* (2006.01)
  *H01L 23/02* (2006.01)
  *H01L 23/48* (2006.01)
  *H01L 23/52* (2006.01)
  *H01L 23/04* (2006.01)

(52) U.S. Cl. .............. 257/693; 257/659; 257/688; 257/691; 257/698

(58) Field of Classification Search .......... 257/659, 257/678, 688, 691, 693, 698
See application file for complete search history.

(56) References Cited

U.S. PATENT DOCUMENTS

| | | | | |
|---|---|---|---|---|
| 5,158,912 A | * | 10/1992 | Kellerman et al. | 438/126 |
| 5,264,729 A | * | 11/1993 | Rostoker et al. | 257/774 |
| 7,609,143 B2 | * | 10/2009 | Huang | 338/22 R |
| 2006/0087012 A1 | * | 4/2006 | Zhong et al. | 257/678 |
| 2007/0109709 A1 | * | 5/2007 | Anthony et al. | 361/118 |
| 2007/0257708 A1 | * | 11/2007 | Shimokawa et al. | 327/5 |

* cited by examiner

*Primary Examiner*—Leonardo Andújar
*Assistant Examiner*—Teresa M. Arroyo
(74) *Attorney, Agent, or Firm*—Rosenberg, Klein & Lee

(57) ABSTRACT

An embedded type multifunctional integrated structure for integrating protection components and a method for manufacturing the same are disclosed. The present invention utilizes the concept of multi-layer design to integrate more than two passive components on a component structure that is adhered onto a substrate and is applied to a USB terminal in order to protect an electronic device that uses the USB. Hence, the present invention has an OCP function, an OVP function, and an anti-ESD function at the same time. Therefore, the present invention effectively integrates two or more passive components in order to increase functionality. Moreover, the present invention effectively reduces the size of the passive components on a PCB and reduces the number of solder joints.

22 Claims, 7 Drawing Sheets

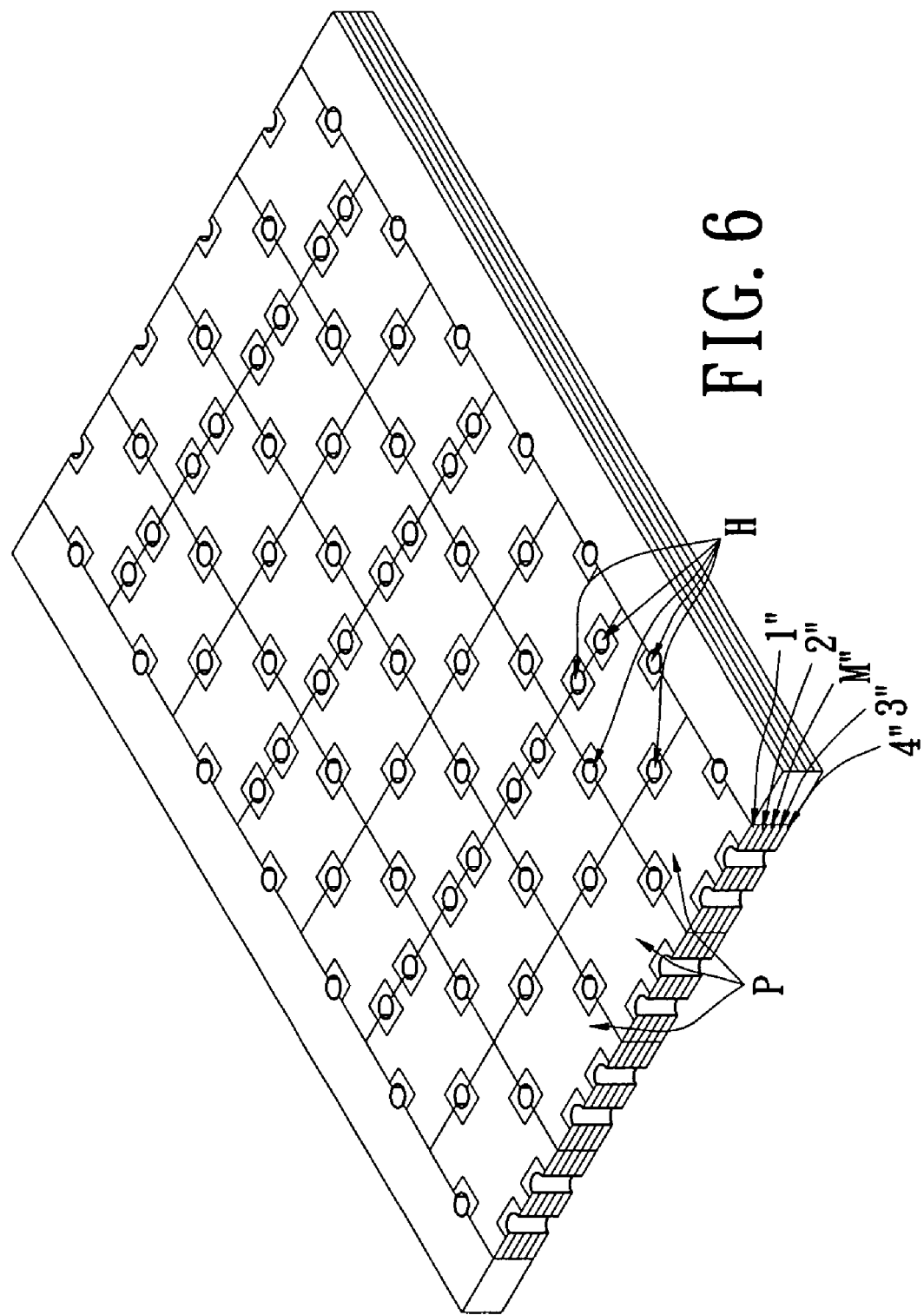

EMBEDDED TYPE MULTIFUNCTIONAL INTEGRATED STRUCTURE FOR INTEGRATING PROTECTION COMPONENTS AND METHOD FOR MANUFACTURING THE SAME

BACKGROUND OF THE INVENTION

1. Field of the Invention

The present invention relates to a multifunctional integrated structure and a method for manufacturing the same, and particularly relates to an embedded type multifunctional integrated structure for integrating protection components and a method for manufacturing the same.

2. Description of the Related Art

Future electronic products have the requirement of being light, thin, short, and small. Moreover, the size of passive electronic components in those products is becoming larger than that of the other components. Hence, if the passive components can be effectively integrated, the electronic product can achieve the quality of being light, thin, short and small.

However, each passive component only has a single function in the prior design. Hence, when a designer needs to use many different functions for protecting the electronic product, the designer only can place many passive components with a single function in the electronic product. Therefore, the method of the prior art wastes cost and occupies much space in the electronic product.

SUMMARY OF THE INVENTION

One particular aspect of the present invention is to provide an embedded type multifunctional integrated structure for integrating protection components and a method for manufacturing the same. The present invention utilizes the concept of multi-layer design to integrate more than two passive components on a component structure that is adhered onto a substrate and is applied to a USB terminal in order to protect an electronic device that uses the USB.

In order to achieve the above-mentioned aspects, the present invention provides an embedded type multifunctional integrated structure for integrating protection components that includes: a top cover insulating layer, an over-current protection layer, a middle insulating layer, a multifunctional protection layer, and a bottom cover insulating layer. The top cover insulating layer, the over-current protection layer, the middle insulating layer, the multifunctional protection layer, and the bottom cover insulating layer are stacked together in sequence, and the multifunctional protection layer has a first functional unit and a second functional unit. Therefore, abnormal currents are transmitted to a grounding side through the over-current protection layer and the first functional unit of the multifunctional protection layer, and abnormal signals are transmitted to the grounding side through the second functional unit of the multifunctional protection layer.

In order to achieve the above-mentioned aspects, the present invention provides an embedded type multifunctional integrated structure for integrating protection components that includes: a top cover insulating layer, an over-current protection layer, a middle insulating layer, a multifunctional protection layer, and a bottom cover insulating layer.

The top cover insulating layer has a first power input portion and two first signal input portions. The over-current protection layer is disposed under the top cover insulating layer, and the over-current protection layer has a second power input portion and a first power output portion. The middle insulating layer is disposed under the over-current protection layer. The multifunctional protection layer is disposed under the middle insulating layer. The multifunctional protection layer has a third power input portion, a first grounding portion, a first functional unit electrically connected between the third power input portion and the first grounding portion, two second signal input portions, and a second functional unit electrically connected between each second signal input portion and the first grounding portion;

The bottom cover insulating layer is disposed under the multifunctional protection layer, and the bottom cover insulating layer has a second power output portion, a second grounding portion, and two first signal output portions. The lateral conductive unit has a first lateral conductive layer, a second lateral conductive layer, a third lateral conductive layer, a fourth lateral conductive layer, and a fifth lateral conductive layer insulated from each other. Each lateral conductive layer from top to bottom is formed on lateral sides of the top cover insulating layer, the over-current protection layer, the middle insulating layer, the multifunctional protection layer, and the bottom cover insulating layer in sequence. Moreover, the first power input portion and the second power input portion are electrically connected with each other via the first lateral conductive layer; the first power output portion, the third power input portion and the second power output portion are electrically connected with each other via the second lateral conductive layer; one of the first signal input portions, one of the two second signal input portions, and one of the first signal output portions are connected with each other via the third lateral conductive layer; the other first signal input portion, the other second signal input portion, and the other first signal output portion are connected with each other via the fourth lateral conductive layer; the first grounding portion and the second grounding portion are connected with each other via the fifth lateral conductive layer.

In order to achieve the above-mentioned aspects, the present invention provides a method for manufacturing an embedded type multifunctional integrated structure for integrating protection components, includes: providing a top cover insulating layer having a first power input portion and two first signal input portions; providing an over-current protection layer disposed under the top cover insulating layer, and the over-current protection layer having a second power input portion and a first power output portion; providing a middle insulating layer disposed under the over-current protection layer; and then providing a multifunctional protection layer disposed under the middle insulating layer, and the multifunctional protection layer having a third power input portion, a first grounding portion, a first functional unit electrically connected between the third power input portion and the first grounding portion, two second signal input portions, and a second functional unit electrically connected between each second signal input portion and the first grounding portion.

The method further includes: providing a bottom cover insulating layer disposed under the multifunctional protection layer, and the bottom cover insulating layer having a second power output portion, a second grounding portion, and two first signal output portions; making the top cover insulating layer, the over-current protection layer, the middle insulating layer, the multifunctional protection layer, and the bottom cover insulating layer stacked together in sequence; and then forming a first lateral conductive layer, a second lateral conductive layer, a third lateral conductive layer, a fourth lateral conductive layer, and a fifth lateral conductive layer insulated from each other, and each lateral conductive layer from top to bottom being formed on lateral sides of the top cover insulating layer, the over-current protection layer, the middle insulating layer, the multifunctional protection layer, and the bottom cover insulating layer in sequence.

Hence, the embedded type multifunctional integrated structure has an OCP (Over-Current Protection) function, an OVP (Over-Voltage Protection) function, and an anti-ESD (Anti-Electrostatic Discharge) function at the same time. Therefore, the present invention effectively integrates two or more than one passive components in order to increase functionality. Moreover, the present invention effectively reduces the size of the passive components on a PCB and reduces the number of solder joints.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIG. 6 is a perspective view of a stacked structure with five layers according to the present invention (before many embedded type multifunctional integrated structure are cut from the stacked structure).

DETAILED DESCRIPTION OF THE PREFERRED EMBODIMENTS

Figure 1A:
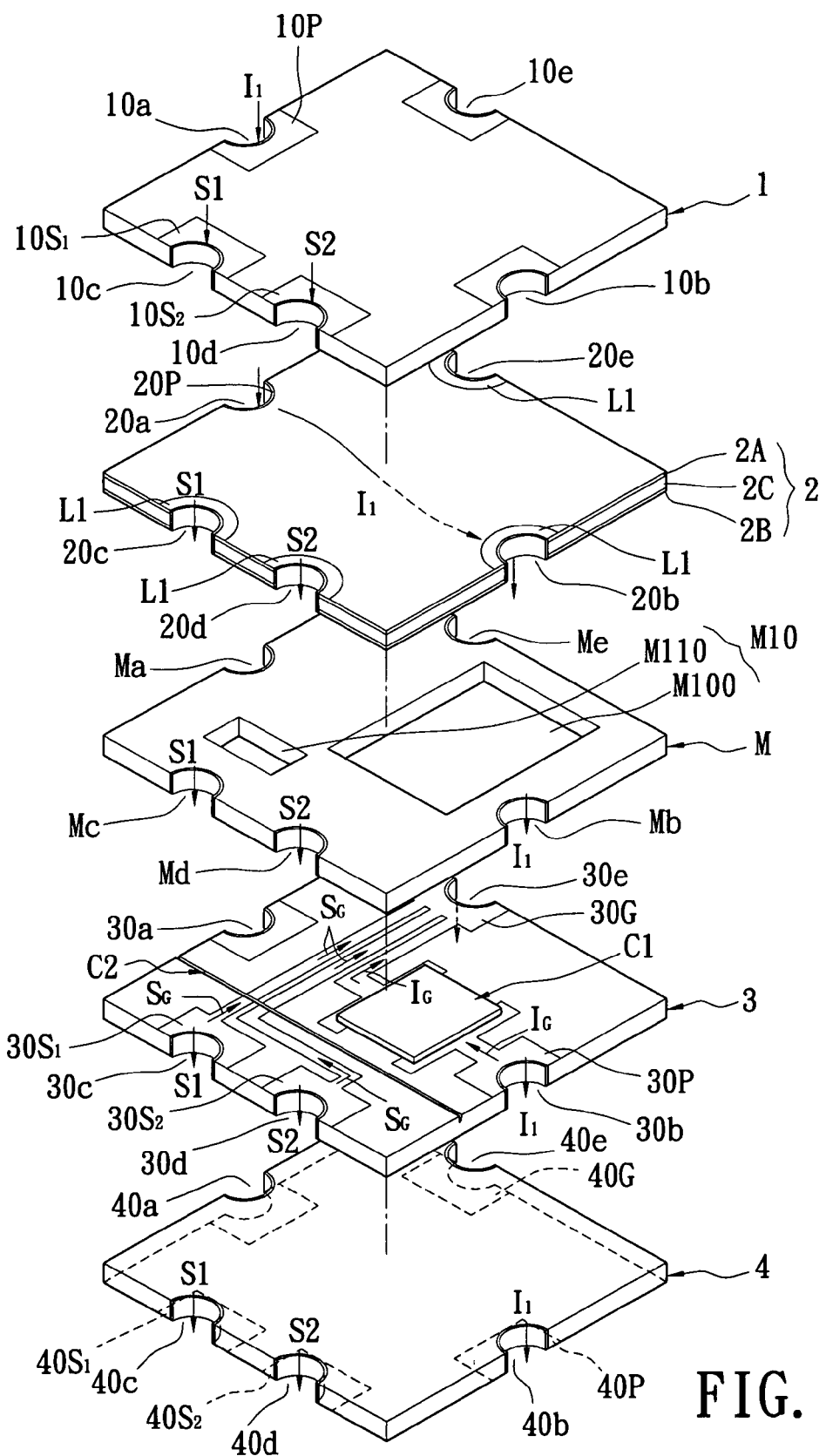
FIG. 1A is a perspective, exploded view of an embedded type multifunctional integrated structure for integrating protection components according to the first embodiment of the present invention.
Figure 1B:
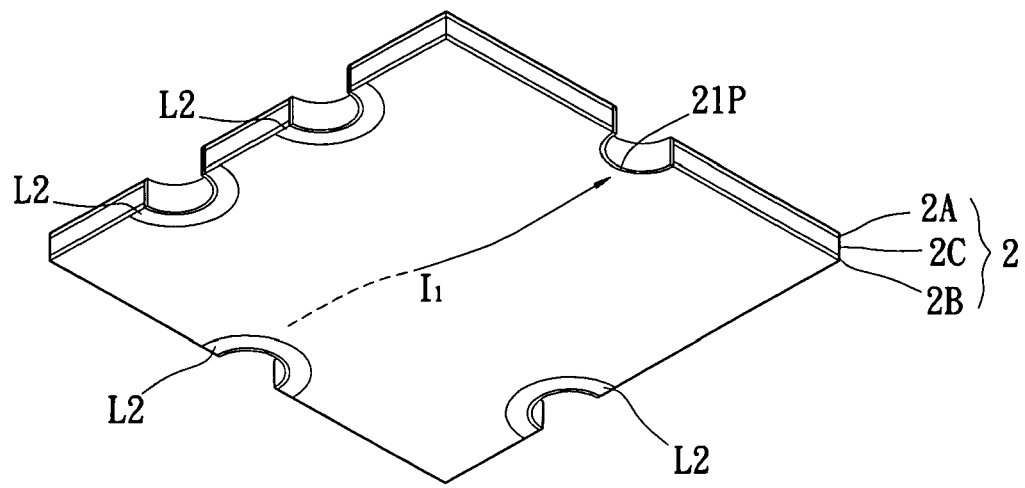
FIG. 1B is a reversed, perspective view of an over-current protection layer according to the first embodiment of the present invention.
Figure 1C:
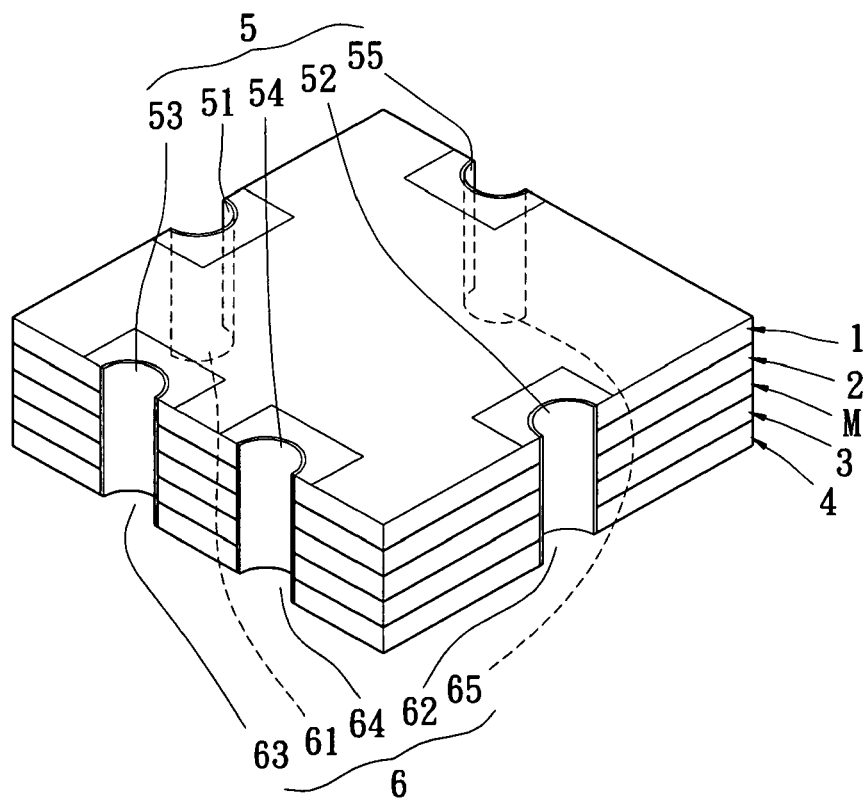
FIG. 1C is a perspective, assembled view of an embedded type multifunctional integrated structure for integrating protection components according to the first embodiment of the present invention.

Referring to FIGS. 1A to 1C, FIG. 1A shows a perspective, exploded view of an embedded type multifunctional integrated structure for integrating protection components according to the first embodiment of the present invention; FIG. 1B shows a reversed, perspective view of an over-current protection layer according to the first embodiment of the present invention; FIG. 1C shows a perspective, assembled view of an embedded type multifunctional integrated structure for integrating protection components according to the first embodiment of the present invention.

Referring to above-mentioned figures, the first embodiment of the present invention provides an embedded type multifunctional integrated structure for integrating protection components that includes a top cover insulating layer 1, an over-current protection layer 2, a middle insulating layer M, a multifunctional protection layer 3, a bottom cover insulating layer 4, and a lateral conductive unit 5. Moreover, the top cover insulating layer 1, the over-current protection layer 2, the middle insulating layer M, the multifunctional protection layer 3, and the bottom cover insulating layer 4 are stacked together in sequence. The lateral conductive unit 5 has a first lateral conductive layer 51, a second lateral conductive layer 52, a third lateral conductive layer 53, a fourth lateral conductive layer 54, and a fifth lateral conductive layer 55 insulated from each other.

In addition, the top cover insulating layer 1 has a first half hole 10a, a second half hole 10b, a third half hole 10c, a fourth half hole 10d, and a fifth half hole 10e distributively formed on four lateral sides thereof. Furthermore, the top cover insulating layer 1 has a first power input portion 10P electrically connected with the first lateral conductive layer 51, and two first signal input portions ($10S_1$, $10S_2$) respectively and electrically connected with the third and the fourth lateral conductive layers (53, 54). Moreover, the first power input portion 10P and the two first signal input-portions ($10S_1$, $10S_2$) are formed on a top surface of the top cover insulating layer 1.

Furthermore, the over-current protection layer 2 is disposed under the top cover insulating layer 1. The over-current protection layer 2 has a first half hole 20a, a second half hole 20b, a third half hole 20c, a fourth half hole 20d, and a fifth half hole 20e distributively formed on four lateral sides thereof. In addition, the over-current protection layer 2 is composed of a first electrode layer 2A, a second electrode layer 2B, and a positive temperature coefficient material layer 2C that is disposed between the first electrode layer 2A and the second electrode layer 2B. The positive temperature coefficient material layer 2C can be a PPTC (Polymer Positive Temperature Coefficient) material layer, a resistance material layer, a capacitance material layer, or an inductance material layer.

In addition, the over-current protection layer 2 has a second power input portion 20P electrically connected with the first lateral conductive layer 51 and a first power output portion 21P (as shown in FIG. 1B) electrically connected with the second lateral conductive layer 52.

The second power input portion 20P is one side of the first electrode layer 2A, and the first power output portion 21P is one side of the second electrode layer 2B. The first electrode layer 2A has a first insulating portion L1 insulated from the second, third, fourth and fifth lateral conductive layers (52, 53, 54, 55), and the second electrode layer 2B has a second insulating portion L2 (as shown in FIG. 2) insulated from the first, third, fourth and fifth lateral conductive layers (51, 53, 54, 55). Hence, the first electrode layer 2A is insulated from the second, third, fourth and fifth lateral conductive layers (52, 53, 54, 55) via the first insulating portion L1, and the second electrode layer 2B is insulated from the first, third, fourth and fifth lateral conductive layers (51, 53, 54, 55) via the second insulating portion L2.

Moreover, the middle insulating layer M is disposed under the over-current protection layer 2. The middle insulating layer M has an opening unit M10 that includes a first opening M100 and a second opening M 110. In addition, the middle insulating layer M has a first half hole Ma, a second half hole Mb, a third half hole Mc, a fourth half hole Md, and a fifth half hole Me distributively formed on four lateral sides thereof.

Furthermore, the multifunctional protection layer 3 is disposed under the middle insulating layer M. The multifunctional protection layer 3 has a first half hole 30a, a second half hole 30b, a third half hole 30c, a fourth half hole 30d, and a fifth half hole 30e distributively formed on four lateral sides thereof.

In addition, the multifunctional protection layer 3 has a third power input portion 30P electrically connected with the second lateral conductive layer 52, a first grounding portion 30G electrically connected with the fifth lateral conductive layer 55, a first functional unit C1 electrically connected between the third power input portion 30P and the first grounding portion 30G, two second signal input portions ($30S_1$, $30S_2$) respectively and electrically connected with the third lateral conductive layer 53 and the fourth lateral conductive layer 54, and a second functional unit C2 electrically connected between each second signal input portion ($30S_1$ or $30S_2$) and the first grounding portion 30G.

Moreover, in the first embodiment, the first functional unit C1, the second functional unit C2, the third power input portion 30P, the first grounding portion 30G, and the two second signal input portions ($30S_1$, $30S_2$) are formed on a top surface of the multifunctional protection layer 3. The first functional unit C1 is a functional chip such as an OVP (Over-Voltage Protection) chip, and the second functional unit C2 is a groove that has a width between 10 μm and 100 μm and a depth between 10 μm and 500 μm. In addition, the first opening M100 is used to receive the first functional unit C1 such as the functional chip and the second opening M110 is used to expose one part of the second functional unit C2 such as one part of the groove.

Moreover, the bottom cover insulating layer 4 is disposed under the multifunctional protection layer 3. The bottom cover insulating layer 4 has a first half hole 40a, a second half hole 40b, a third half hole 40c, a fourth half hole 40d, and a fifth half hole 40e distributively formed on four lateral sides thereof. In addition, the bottom cover insulating layer 4 has a second power output portion 40P electrically connected with the second lateral conductive layer 52, a second grounding portion 40G electrically connected with the fifth lateral conductive layer 55, and two first signal output portions ($40S_1$, $40S_2$) respectively and electrically connected with the third lateral conductive layer 53 and the fourth lateral conductive layer 55. The second power output portion 40P, the second grounding portion 40G and the first signal output portions ($40S_1$, $40S_2$) are formed on a bottom surface of the bottom cover insulating layer 4.

In addition, referring to FIG. 1C, each lateral conductive layer (51, 52, 53, 54 or 55) from top to bottom is formed on lateral sides of the top cover insulating layer 1, the over-current protection layer 2, the middle insulating layer M, the multifunctional protection layer 3, and the bottom cover insulating layer 4 in sequence.

Furthermore, the first half hole 10a of the top cover insulating layer 1, the first half hole 20a of the over-current protection layer 2, the first half hole Ma of the middle insulating layer M, the first half hole 30a of the multifunctional protection layer 3, and the first half hole 40a of the bottom cover insulating layer 4 are stacked together to form a first lateral through groove 61. The second half hole 10b of the top cover insulating layer 1, the second half hole 20b of the over-current protection layer 2, the second half hole Mb of the middle insulating layer M, the second half hole 30b of the multifunctional protection layer 3, and the second half hole 40b of the bottom cover insulating layer 4 are stacked together to form a second lateral through groove 62. The third half hole 10c of the top cover insulating layer 1, the third half hole 20c of the over-current protection layer 2, the third half hole Mc of the middle insulating layer M, the third half hole 30c of the multifunctional protection layer 3, and the third half hole 40c of the bottom cover insulating layer 4 are stacked together to form a third lateral through groove 63. The fourth half hole 10d of the top cover insulating layer 1, the fourth half hole 20d of the over-current protection layer 2, the fourth half hole Md of the middle insulating layer M, the fourth half hole 30d of the multifunctional protection layer 3, and the fourth half hole 40d of the bottom cover insulating layer 4 are stacked together to form a fourth lateral through groove 64. The fifth half hole 10e of the top cover insulating layer 1, the fifth half hole 20e of the over-current protection layer 2, the fifth half hole Me of the middle insulating layer M, the fifth half hole 30e of the multifunctional protection layer 3, and the fifth half hole 40e of the bottom cover insulating layer 4 are stacked together to form a fifth lateral through groove 65.

Therefore, the first lateral through groove 61 is composed of the first half holes (10a, 20a, Ma, 30a, 40a) that are respectively formed on the same sides of the top cover insulating layer 1, the over-current protection layer 2, the middle insulating layer M, the multifunctional protection layer 3, and the bottom cover insulating layer 4. The second lateral through groove 62 is composed of the second half holes (10b, 20b, Mb, 30b, 40b) that are respectively formed on the same sides of the top cover insulating layer 1, the over-current protection layer 2, the middle insulating layer M, the multifunctional protection layer 3, and the bottom cover insulating layer 4. The third lateral through groove 63 is composed of the third half holes (10c, 20c, Mc, 30c, 40c) that are respectively formed on the same sides of the top cover insulating layer 1, the over-current protection layer 2, the middle insulating layer M, the multifunctional protection layer 3, and the bottom cover insulating layer 4. The fourth lateral through groove 64 is composed of the fourth half holes (10d, 20d, Md, 30d, 40d) that are respectively formed on the same sides of the top cover insulating layer 1, the over-current protection layer 2, the middle insulating layer M, the multifunctional protection layer 3, and the bottom cover insulating layer 4. The fifth lateral through groove 65 is composed of the fifth half holes (10e, 20e, Me, 30e, 40e) that are respectively formed on the same sides of the top cover insulating layer 1, the over-current protection layer 2, the middle insulating layer M, the multifunctional protection layer 3, and the bottom cover insulating layer 4.

Moreover, the first lateral through groove 61, the second lateral through groove 62, the third lateral through groove 63, the fourth lateral through groove 64, and the fifth lateral through groove 65 separated from each other are combined to formed a lateral through groove unit 6. In addition, the first lateral conductive layer 51 is formed on an inner surface of the first lateral through groove 61, the second lateral conductive layer 52 is formed on an inner surface of the second lateral through groove 62, the third lateral conductive layer 53 is formed on an inner surface of the third lateral through groove 63, the fourth lateral conductive layer 54 is formed on an inner surface of the fourth lateral through groove 64, and the fifth lateral conductive layer 55 is formed on an inner surface of the fifth lateral through groove 65.

Hence, the first power input portion 10P and the second power input portion 20P are electrically connected with each other via the first lateral conductive layer 51. The first power output portion 21P, the third power input portion 30P and the second power output portion 40P are electrically connected with each other via the second lateral conductive layer 52. One first signal input portion $10S_1$, one second signal input portion $30S_1$, and one first signal output portion $40S_1$ are connected with each other via the third lateral conductive layer 53. The other first signal input portion $10S_2$, the other second signal input portion $30S_2$, and the other first signal output portion $40S_2$ are connected with each other via the fourth lateral conductive layer 54. The first grounding portion 30G and the second grounding portion 40G are connected with each other via the fifth lateral conductive layer 55.

Referring to FIGS. 1A to 1C, the arrows mean the directions of current $I_1$ and signals (S1, S2) in the above-mentioned figures. The main path of the current $I_1$ in each layer from the top cover insulating layer 1 to the bottom cover insulating layer 4 is shown as follows:

First layer (the top cover insulating layer 1): The current $I_1$ flows from the first power input portion 10P of the top cover insulating layer 1 to the second power input portion 20P via the first lateral conductive layer 51.

Second layer (the over-current protection layer 2): The current $I_1$ flows through the first electrode layer 2A, the positive temperature coefficient material layer 2C, and the second electrode layer 2B in sequence and flows from the second power input portion 20P to the first power output portion 21P. Hence, the present invention has the function of OCP (Over-Current Protection) due to the material property of the positive temperature coefficient material layer 2C.

Third layer (the middle insulating layer M): The current $I_1$ flows from the first power output portion 21P to the third power input portion 30P of the multifunctional protection layer 3 via the second lateral conductive layer 52.

Fourth layer (the multifunctional protection layer 3): The flowing direction of the current $I_1$ is determined according to the setting of the first functional unit C1. Hence, the normal current $I_1$ flows to next layer directly. The abnormal current $I_G$ flows from the third power input portion 30P to the first grounding portion 30G through the first functional unit C1. For example, the first functional unit C1 is an OVP (Over-Voltage Protection) chip and the voltage load of the OVP chip is 5 volt. Hence, when the current is smaller than 5 volt, the current is outputted normally; when the current is larger than 5 volt, the current is transmitted to the grounding side through the OVP chip.

Fifth layer (the bottom cover insulating layer 4): The normal current $I_1$ flows to the second power output portion 40P of the bottom cover insulating layer 4 via the second lateral conductive layer 52. The abnormal current $I_G$ flows from the first grounding portion 30G to the second grounding portion 40G of the bottom cover insulating layer 4 and is transmitted to the grounding side via the fifth lateral conductive layer 55.

The main path of two signals (S1, S2) in each layer from the top cover insulating layer 1 to the bottom cover insulating layer 4 is shown as follows:

First layer (the top cover insulating layer 1): The two signals (S1, S2) flow from the two first signal input portions ($10S_1$, $10S_2$) of the top cover insulating layer 1 to the two second signal input portions ($30S_1$, $30S_2$) of the multifunctional protection layer 3 via the third lateral conductive layer 53 and the fourth lateral conductive layer 54, respectively.

Fourth layer (the multifunctional protection layer 3): The flowing directions of the two signals (S1, S2) are determined according to the setting of the second functional unit C2. Hence, the two normal signals (S1, S2) flow to next layer directly. The abnormal signal $S_G$ flows from the two second signal input portions ($30S_1$, $30S_2$) to the first grounding portion 30G through the second functional unit C2.

Fifth layer (the bottom cover insulating layer 4): The two normal signals (S1, S2) flow to the first signal output portions (40S1, 40S2) of the bottom cover insulating layer 4 via the third lateral conductive layer 53 and the fourth lateral conductive layer 54, respectively. The abnormal signal $S_G$ flows from the first grounding portion 30G to the second grounding portion 40G of the bottom cover insulating layer 4 and is transmitted to the grounding side via the fifth lateral conductive layer 55.

Figure 2A:
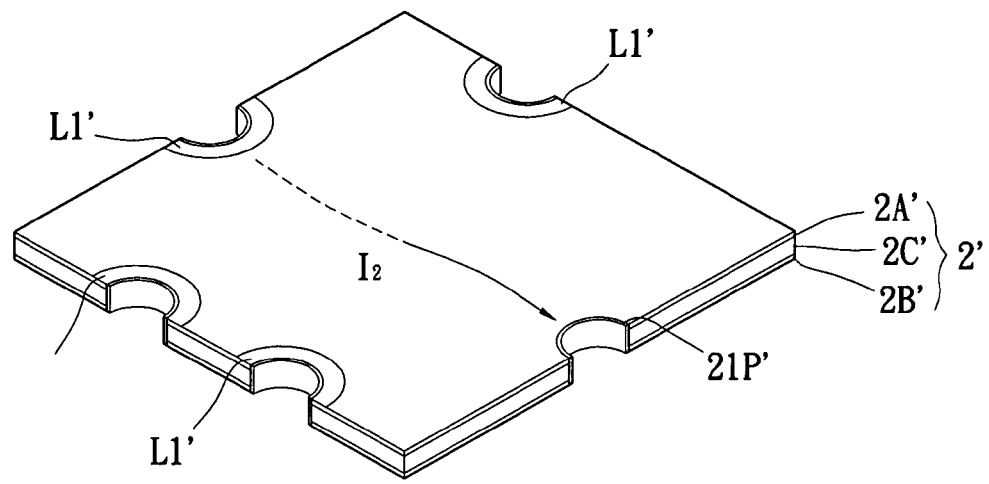
FIG. 2A is a perspective view of an over-current protection layer according to the second embodiment of the present invention.
Figure 2B:
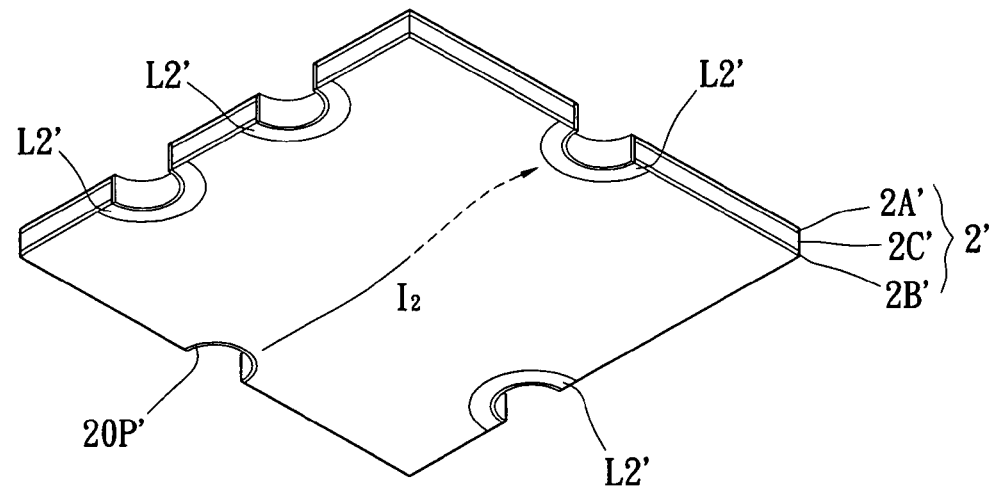
FIG. 2B is a reversed, perspective view of an over-current protection layer according to the second embodiment of the present invention.

Referring to FIGS. 2A and 2B, FIG. 2A shows a perspective view of an over-current protection layer according to the second embodiment of the present invention; FIG. 2B shows a reversed, perspective view of an over-current protection layer according to the second embodiment of the present. The difference between the second embodiment and the first embodiment is that: in the second embodiment, the second power input portion 20P' is one side of the second electrode layer 2B', the first power output portion 21P' is one side of the first electrode layer 2A', the first electrode layer 2A' has a first insulating portion L1' (as shown in FIG. 2A) insulated from the first, third, fourth and fifth lateral conductive layers (51, 53, 54, 55), and the second electrode layer 2B' has a second insulating portion L2' (as shown in FIG. 2B) insulated from the second, third, fourth and fifth lateral conductive layers (52, 53, 54, 55). Hence, the first electrode layer 2A' is insulated from the first, third, fourth and fifth lateral conductive layers (51, 53, 54, 55) via the first insulating portion L1', and the second electrode layer 2B' is insulated from the second, third, fourth and fifth lateral conductive layers (52, 53, 54, 55) via the second insulating portion L2'.

Therefore, a current path of a second layer (the over-current protection layer 2') of the second embodiment is that the current $I_2$ flows through the second electrode layer 2B', the positive temperature coefficient material layer 2C', and the first electrode layer 2A' in sequence and flows from the second power input portion 20P' to the first power output portion 21P'.

Figure 3A:
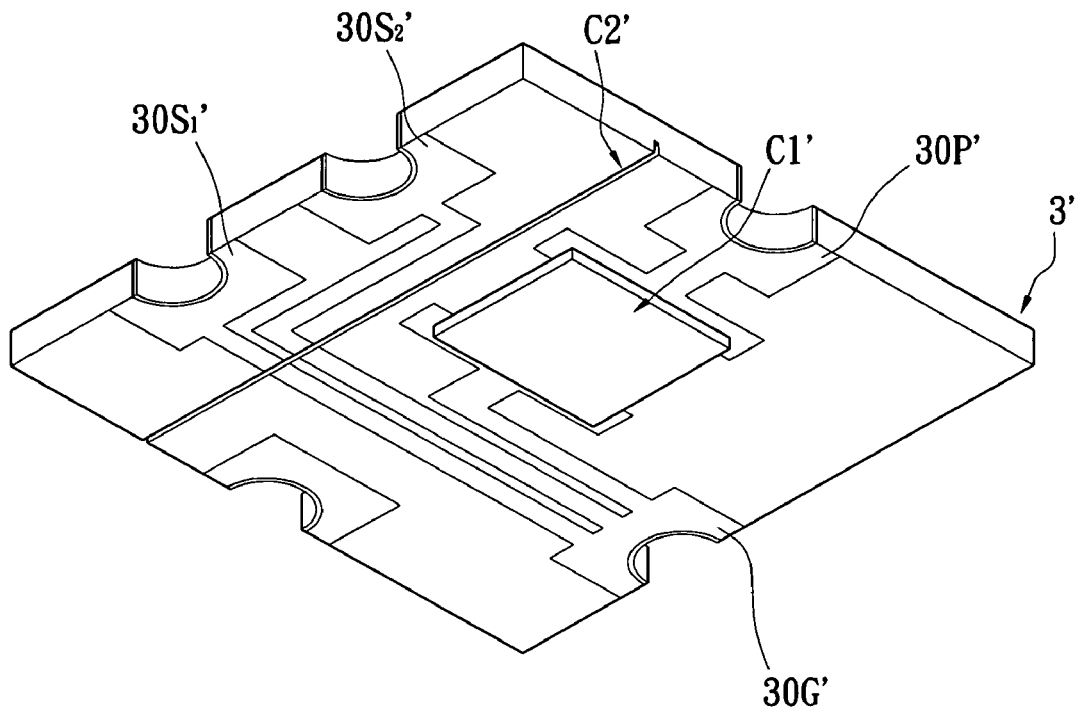
FIG. 3A is a perspective view of a multifunctional protection layer according to the third embodiment of the present invention.
Figure 3B:
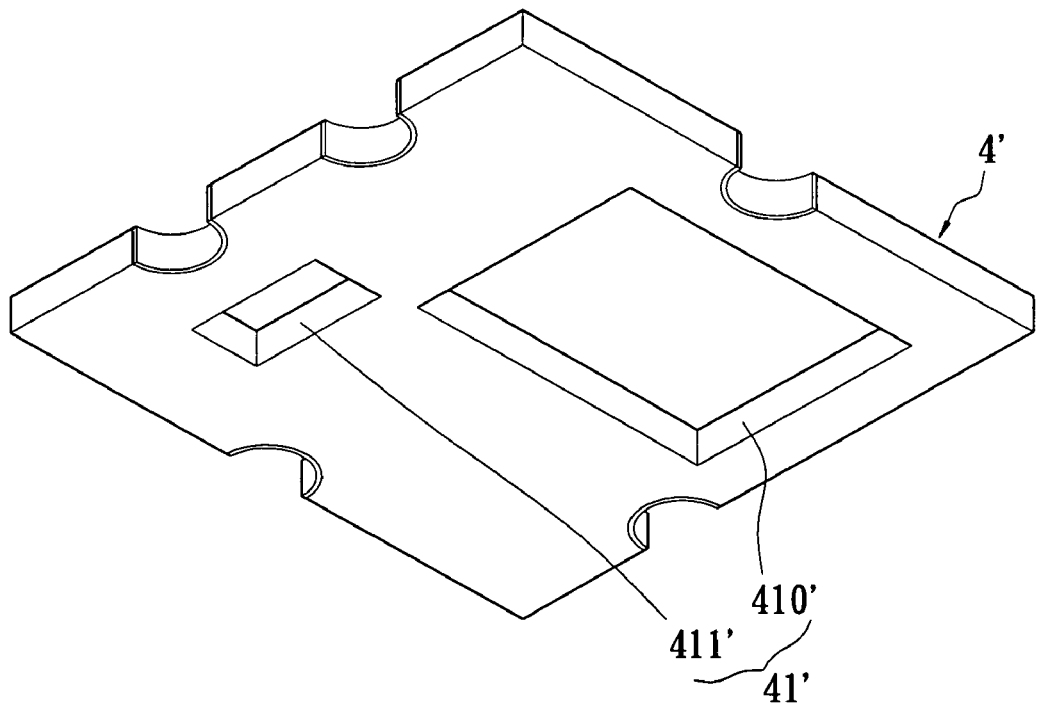
FIG. 3B is a reversed, perspective view of a bottom cover insulating layer according to the third embodiment of the present invention.

Referring to FIGS. 3A and 3B, FIG. 3A shows a perspective view of a multifunctional protection layer according to the third embodiment of the present invention; FIG. 3B shows a reversed, perspective view of a bottom cover insulating layer according to the third embodiment of the present. The difference between the third embodiment and the first embodiment is that: in the third embodiment, the first functional unit C1', the second functional unit C2', the third power input portion 30P', the first grounding portion 30G', and the two second signal input portions ($30S_1'$, $30S_2'$) are formed on a bottom surface of the multifunctional protection layer 3', and the bottom cover insulating layer 4' has an opening unit 41'. The opening unit 41' has a first opening 410' and a second opening 411'. The first opening 410' is used to receive the first functional unit C1' such as a functional chip and the second opening 411' is used to expose one part of the second functional unit C2' such as one part of a groove.

Furthermore, the present invention can combine the first embodiment and the third embodiment, so the first functional unit C1, the second functional unit C2, the third power input portion 30P, the first grounding portion 30G, and the two second signal input portions ($30S_1$, $30S_2$) are formed on the top surface of the multifunctional protection layer 3 (as shown in the first embodiment of FIG. 1A), and the first functional unit C1', the second functional unit C2', the third power input portion 30P', the first grounding portion 30G', and the two second signal input portions ($30S_1'$, $30S_2'$) are formed on the bottom surface of the multifunctional protection layer 3' (as shown in the third embodiment of FIG. 3A).

Figure 4:
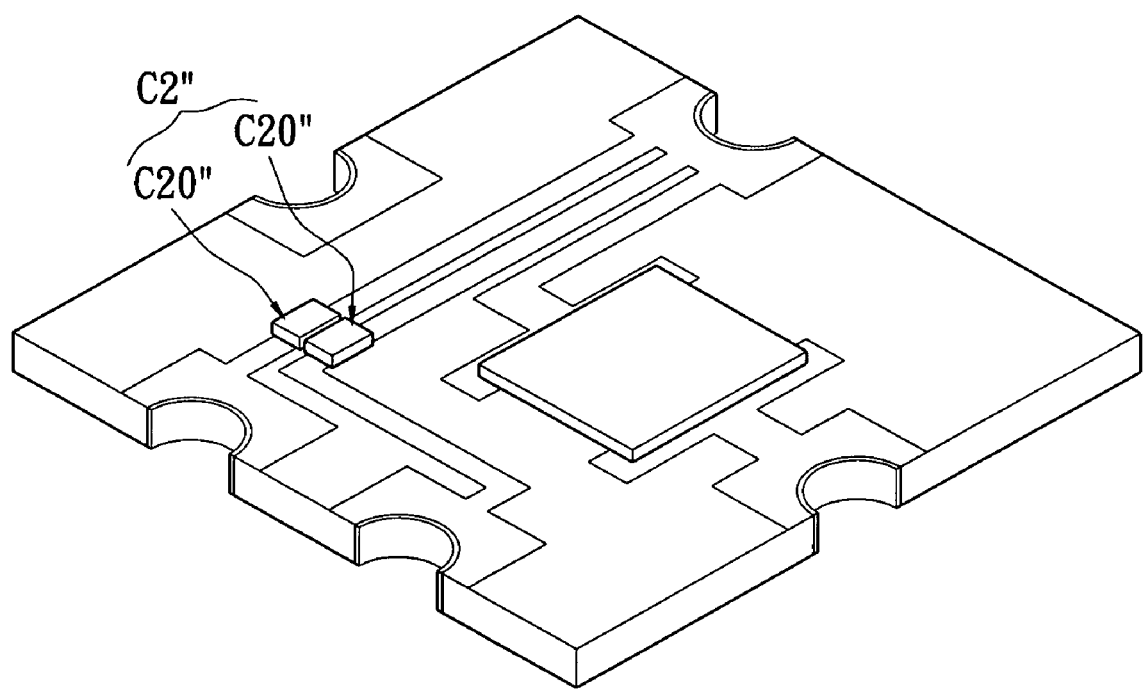
FIG. 4 is a perspective view of a multifunctional protection layer according to the fourth embodiment of the present invention.

FIG. 4 shows a perspective view of a multifunctional protection layer according to the fourth embodiment of the present. The difference between the fourth embodiment and the first embodiment is that: in the fourth embodiment, the second functional unit C2" is two functional chips C20" such as two anti-ESD (anti-Electrostatic Discharge) chips, and a second opening (not shown) is used to receive the two functional chips.

Figure 5:
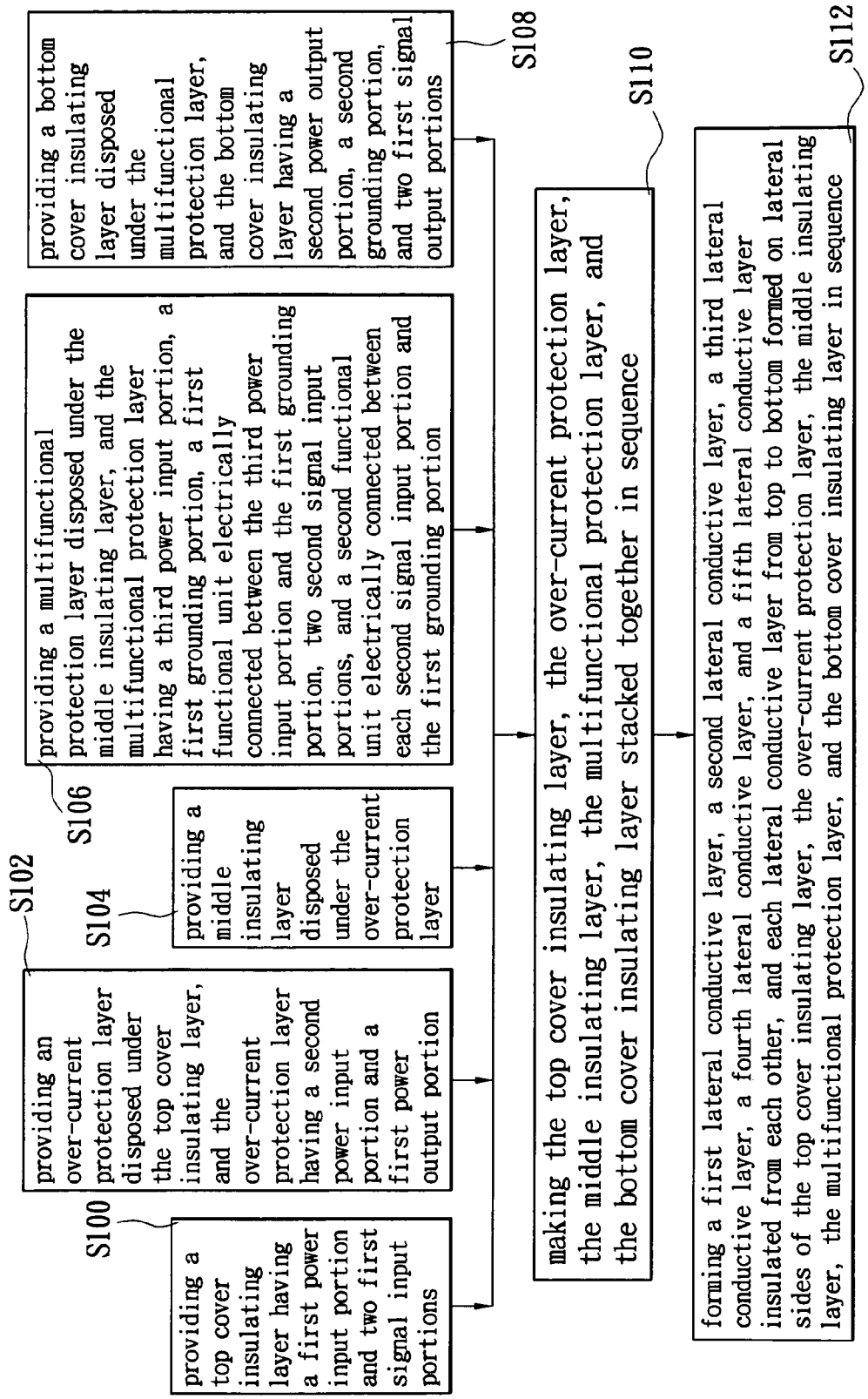
FIG. 5 is a flowchart of a method for manufacturing an embedded type multifunctional integrated structure for integrating protection components according to the present.

FIG. 5 shows a flowchart of a method for manufacturing an embedded type multifunctional integrated structure for integrating protection components according to the present. The method for manufacturing the embedded type multifunctional integrated structure for integrating protection components includes:

Step S100 is providing a top cover insulating layer 1 having a first power input portion 10P and two first signal input portions ($10S_1$, $10S_2$).

Step S102 is providing an over-current protection layer 2 disposed under the top cover insulating layer 1, and the over-current protection layer 2 having a second power input portion 20P and a first power output portion 21P.

Step S104 is providing a middle insulating layer M disposed under the over-current protection layer 2.

Step S106 is providing a multifunctional protection layer 3 disposed under the middle insulating layer M, and the multifunctional protection layer 3 having a third power input portion 30P, a first grounding portion 30G, a first functional unit C1 electrically connected between the third power input portion 30P and the first grounding portion 30G, two second signal input portions ($30S_1$, $30S_2$), and a second functional unit C2 electrically connected between each second signal input portion ($30S_1$, $30S_2$) and the first grounding portion 30G.

Step S108 is providing a bottom cover insulating layer 4 disposed under the multifunctional protection layer 3, and the bottom cover insulating layer 4 having a second power output portion 40P, a second grounding portion 40G, and two first signal output portions ($40S_1$, $40S_2$).

Step S110 is making the top cover insulating layer 1, the over-current protection layer 2, the middle insulating layer M, the multifunctional protection layer 3, and the bottom cover insulating layer 4 stacked together in sequence.

Step S112 is forming a first lateral conductive layer 51, a second lateral conductive layer 52, a third lateral conductive layer 53, a fourth lateral conductive layer 54, and a fifth lateral conductive layer 55 insulated from each other, and each lateral conductive layer (51, 52, 53, 54, 55) from top to bottom formed on lateral sides of the top cover insulating layer 1, the over-current protection layer 2, the middle insulating layer M, the multifunctional protection layer 3, and the bottom cover insulating layer 4 in sequence.

Therefore, the first power input portion 10P and the second power input portion 20P are electrically connected with each other via the first lateral conductive layer 51. The first power output portion 21P, the third power input portion 30P and the second power output portion 40P are electrically connected with each other via the second lateral conductive layer 52. One first signal input portion $10S_1$, one second signal input portion $30S_1$, and one first signal output portion $40S_1$, are connected with each other via the third lateral conductive layer 53. The other first signal input portion $10S_2$, the other second signal input portion $30S_2$, and the other first signal output portion $40S_2$ are connected with each other via the fourth lateral conductive layer 54. The first grounding portion 30G and the second grounding portion 40G are connected with each other via the fifth lateral conductive layer 55.

Moreover, before the step S112 of forming the lateral conductive layers, the method further comprises: forming a first lateral through groove 61, a second lateral through groove 62, a third lateral through groove 63, a fourth lateral through groove 64, and a fifth lateral through groove 65 separated from each other. Each lateral through groove (61, 62, 63, 64, 65) is formed via drilling or punching the top cover insulating layer 1, the over-current protection layer 2, the middle insulating layer M, the multifunctional protection layer 3, and the bottom cover insulating layer 4 in sequence. In addition, the first lateral conductive layer 51 is formed on an inner surface of the first lateral through groove 61, the second lateral conductive layer 52 is formed on an inner surface of the second lateral through groove 62, the third lateral conductive layer 53 is formed on an inner surface of the third lateral through groove 63, the fourth lateral conductive layer 54 is formed on an inner surface of the fourth lateral through groove 64, and the fifth lateral conductive layer 55 is formed on an inner surface of the fifth lateral through groove 65.

FIG. 6 shows a perspective view of a stacked structure with five layers according to the present invention (before many embedded type multifunctional integrated structure for integrating protection components are cut from the stacked structure). Each top cover insulating layer 1", each over-current protection layer 2", each middle insulating layer M", each multifunctional protection layer 3", and each bottom cover insulating layer 4" are drilled or punched in sequence to form a plurality of through holes H. Many conductive layers from top to bottom are respectively coated on inner surfaces of the through holes H of each top cover insulating layer 1", each over-current protection layer 2", each middle insulating layer M", each multifunctional protection layer 3", and each bottom cover insulating layer 4". Finally, each embedded type multifunctional integrated structure P (as shown in FIG. 1C) is cut from the stacked structure. Hence, the present invention can manufacture many embedded type multifunctional integrated structure P at the same time.

In conclusion, the present invention utilizes the concept of multi-layer design to integrate more than two passive components on a component structure that is adhered onto a substrate and is applied to a USB terminal in order to protect an electronic device that uses the USB. Hence, the present invention has an OCP function, an OVP function, and an anti-ESD function at the same time. Therefore, the present invention effectively integrates two or more passive components in order to increase functionality. Moreover, the present invention effectively reduces the size of the passive components on a PCB and reduces the number of solder joints.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An embedded type multifunctional integrated structure for integrating protection components, comprising:
   a top cover insulating layer having a first power input portion and two first signal input portions;
   an over-current protection layer disposed under the top cover insulating layer, wherein the over-current protection layer has a second power input portion and a first power output portion;
   a middle insulating layer disposed under the over-current protection layer;

a multifunctional protection layer disposed under the middle insulating layer, wherein the multifunctional protection layer has a third power input portion, a first grounding portion, a first functional unit electrically connected between the third power input portion and the first grounding portion, two second signal input portions, and a second functional unit electrically connected between each second signal input portion and the first grounding portion;

a bottom cover insulating layer disposed under the multifunctional protection layer, wherein the bottom cover insulating layer has a second power output portion, a second grounding portion, and two first signal output portions; and a lateral conductive unit having a first lateral conductive layer, a second lateral conductive layer, a third lateral conductive layer, a fourth lateral conductive layer, and a fifth lateral conductive layer insulated from each other, wherein each lateral conductive layer from top to bottom is formed on lateral sides of the top cover insulating layer, the over-current protection layer, the middle insulating layer, the multifunctional protection layer, and the bottom cover insulating layer in sequence;

wherein the first power input portion and the second power input portion are electrically connected with each other via the first lateral conductive layer; the first power output portion, the third power input portion and the second power output portion are electrically connected with each other via the second lateral conductive layer; one of the first signal input portions, one of the two second signal input portions, and one of the first signal output portions are connected with each other via the third lateral conductive layer; the other first signal input portion, the other second signal input portion, and the other first signal output portion are connected with each other via the fourth lateral conductive layer; the first grounding portion and the second grounding portion are connected with each other via the fifth lateral conductive layer.

2. The embedded type multifunctional integrated structure as claimed in claim 1, further comprising a lateral through groove unit that has a first lateral through groove, a second lateral through groove, a third lateral through groove, a fourth lateral through groove, and a fifth lateral through groove separated from each other, wherein the first lateral conductive layer is formed on an inner surface of the first lateral through groove, the second lateral conductive layer is formed on an inner surface of the second lateral through groove, the third lateral conductive layer is formed on an inner surface of the third lateral through groove, the fourth lateral conductive layer is formed on an inner surface of the fourth lateral through groove, and the fifth lateral conductive layer is formed on an inner surface of the fifth lateral through groove.

3. The embedded type multifunctional integrated structure as claimed in claim 2, wherein the first lateral through groove is composed of a plurality of first half hole respectively formed on the same sides of the top cover insulating layer, the over-current protection layer, the middle insulating layer, the multifunctional protection layer, and the bottom cover insulating layer; wherein the second lateral through groove is composed of a plurality of second half hole respectively formed on the same sides of the top cover insulating layer, the over-current protection layer, the middle insulating layer, the multifunctional protection layer, and the bottom cover insulating layer; wherein the third lateral through groove is composed of a plurality of third half hole respectively formed on the same sides of the top cover insulating layer, the over-current protection layer, the middle insulating layer, the multifunctional protection layer, and the bottom cover insulating layer; wherein the fourth lateral through groove is composed of a plurality of fourth half hole respectively formed on the same sides of the top cover insulating layer, the over-current protection layer, the middle insulating layer, the multifunctional protection layer, and the bottom cover insulating layer; wherein the fifth lateral through groove is composed of a plurality of fifth half hole respectively formed on the same sides of the top cover insulating layer, the over-current protection layer, the middle insulating layer, the multifunctional protection layer, and the bottom cover insulating layer.

4. The embedded type multifunctional integrated structure as claimed in claim 1, wherein the over-current protection layer is composed of a first electrode layer, a second electrode layer, and a positive temperature coefficient material layer that is disposed between the first electrode layer and the second electrode layer.

5. The embedded type multifunctional integrated structure as claimed in claim 4, wherein the positive temperature coefficient material layer is a PPTC (Polymer Positive Temperature Coefficient) material layer, a resistance material layer, a capacitance material layer, or an inductance material layer.

6. The embedded type multifunctional integrated structure as claimed in claim 4, wherein the second power input portion is one side of the first electrode layer, and the first power output portion is one side of the second electrode layer; wherein the first electrode layer has a first insulating portion insulated from the second, third, fourth and fifth lateral conductive layers, and the second electrode layer has a second insulating portion insulated from the first, third, fourth and fifth lateral conductive layers.

7. The embedded type multifunctional integrated structure as claimed in claim 4, wherein the second power input portion is one side of the second electrode layer, and the first power output portion is one side of the first electrode layer; wherein the first electrode layer has a first insulating portion insulated from the first, third, fourth and fifth lateral conductive layers, and the second electrode layer has a second insulating portion insulated from the second, third, fourth and fifth lateral conductive layers.

8. The embedded type multifunctional integrated structure as claimed in claim 1, wherein the first functional unit, the second functional unit, the third power input portion, the first grounding portion, and the two second signal input portions are formed on a top surface of the multifunctional protection layer, and the middle insulating layer has an opening unit for exposing the first functional unit and the second functional unit.

9. The embedded type multifunctional integrated structure as claimed in claim 8, wherein the first functional unit is a functional chip, the second functional unit is a groove, and the opening unit has a first opening for receiving the functional chip and a second opening for exposing the groove.

10. The embedded type multifunctional integrated structure as claimed in claim 9, wherein the functional chip is an OVP (Over-Voltage Protection) chip.

11. The embedded type multifunctional integrated structure as claimed in claim 9, wherein the groove has a width between 10 μm and 100 μm and a depth between 10 μm and 500 μm.

12. The embedded type multifunctional integrated structure as claimed in claim 8, wherein the first functional unit is a first functional chip, the second functional unit is a second functional chip, and the opening unit has a first opening for receiving the first functional chip and a second opening for receiving the second functional chip.

13. The embedded type multifunctional integrated structure as claimed in claim 12, wherein the first functional chip is an OVP (Over-Voltage Protection) chip, and the second functional chip is an anti-ESD (anti-Electrostatic Discharge) chip.

14. The embedded type multifunctional integrated structure as claimed in claim 1, wherein the first functional unit, the second functional unit, the third power input portion, the first grounding portion, and the two second signal input portions are formed on a bottom surface of the multifunctional protection layer, and the bottom cover insulating layer has an opening unit for exposing the first functional unit and the second functional unit.

15. The embedded type multifunctional integrated structure as claimed in claim 14, wherein the first functional unit is a functional chip, the second functional unit is a groove, and the opening unit has a first opening for receiving the functional chip and a second opening for exposing the groove.

16. The embedded type multifunctional integrated structure as claimed in claim 15, wherein the functional chip is an OVP (Over-Voltage Protection) chip.

17. The embedded type multifunctional integrated structure as claimed in claim 15, wherein the groove has a width between 10 μm and 100 μm and a depth between 10 μm and 500 μm.

18. The embedded type multifunctional integrated structure as claimed in claim 14, wherein the first functional unit is a first functional chip, the second functional unit is a second functional chip, and the opening unit has a first opening for receiving the first functional chip and a second opening for receiving the second functional chip.

19. The embedded type multifunctional integrated structure as claimed in claim 18, wherein the first functional chip is an OVP (Over-Voltage Protection) chip, and the second functional chip is an anti-ESD (anti-Electrostatic Discharge) chip.

20. The embedded type multifunctional integrated structure as claimed in claim 1, wherein the second power output portion, the second grounding portion, and the first signal output portions are formed on a bottom surface of the bottom cover insulating layer.

21. The embedded type multifunctional integrated structure as claimed in claim 1, wherein the top cover insulating layer, the over-current protection layer, the middle insulating layer, the multifunctional protection layer, and the bottom cover insulating layer are stacked together in sequence.

22. An embedded type multifunctional integrated structure for integrating protection components, comprising: a top cover insulating layer, an over-current protection layer, a middle insulating layer, a multifunctional protection layer, and a bottom cover insulating layer, wherein the top cover insulating layer, the over-current protection layer, the middle insulating layer, the multifunctional protection layer, and the bottom cover insulating layer are stacked together in sequence, and the multifunctional protection layer has a first functional unit and a second functional unit; whereby, abnormal currents are transmitted to a grounding side through the over-current protection layer and the first functional unit of the multifunctional protection layer, and abnormal signals are transmitted to the grounding side through the second functional unit of the multifunctional protection layer.

* * * * *